US006675348B1

(12) United States Patent
Hammons, Jr. et al.

(10) Patent No.: US 6,675,348 B1
(45) Date of Patent: Jan. 6, 2004

(54) TURBO-LIKE FORWARD ERROR CORRECTION ENCODER AND DECODER WITH IMPROVED WEIGHT SPECTRUM AND REDUCED DEGRADATION IN THE WATERFALL PERFORMANCE REGION

(75) Inventors: A. Roger Hammons, Jr., North Potomac, MD (US); Hehsam El Gamal, Laurel, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 573 days.

(21) Appl. No.: 09/636,789

(22) Filed: Aug. 11, 2000

Related U.S. Application Data
(60) Provisional application No. 60/148,919, filed on Aug. 13, 1999.

(51) Int. Cl.[7] .............................................. H03M 13/03
(52) U.S. Cl. ...................................................... 714/790
(58) Field of Search ................................. 714/786–794

(56) References Cited

U.S. PATENT DOCUMENTS

| | | | | |
|---|---|---|---|---|
| 5,729,560 A | * | 3/1998 | Hagenauer et al. | 714/786 |
| 6,023,783 A | * | 2/2000 | Divsalar et al. | 714/792 |
| 6,289,486 B1 | * | 9/2001 | Lee et al. | 714/788 |

OTHER PUBLICATIONS

"Code and Parse Trees for Lossless Source Encoding" by Abrahams, J. in Proceedings Compression and Complexity of Sequences Jun. 11–13, 1997 Page(s): 145–171.*

"Analysis of Puncturing Pattern for High Rate Turbo Codes" by Fan Mo et al. in Military Communications Conference Proceedings, 1999. (MILCOM 1999) IEEE vol.: 1, 1999 Page(s): 547–550.*

* cited by examiner

*Primary Examiner*—Albert Decady
*Assistant Examiner*—Cynthia Britt
(74) *Attorney, Agent, or Firm*—John T. Whelan; Michael Sales

(57) ABSTRACT

An encoder, decoder, method of encoding, and method of decoding which preserves the turbo coder performance in the waterfall region, while improving upon performance in the error asymptote region, by applying a parser or other similar element to the input bit stream. The parser assigns input bits to a subset of constituent encoders in a pseudo-random fashion. The parsing strategy breaks up input sequences producing low Hamming weight error events, thereby improving the weight spectrum and asymptotic performance of the code, while not impacting waterfall region performance. The parser or other similar element may also strengthen the weight spectrum without adversely affecting convergence of a corresponding decoder.

20 Claims, 5 Drawing Sheets

FIG. 6

| x0 | x1 | x2 | x3 | x4 | x5 | x6 | x7 | x8 | x9 | x10 | x11 | x12 | x13 | x14 | x15 | x16 | x17 |
|----|----|----|----|----|----|----|----|----|----|-----|-----|-----|-----|-----|-----|-----|-----|
| A  | A  |    | A  | A  |    | A  | A  |    | A  | A   |     | A   | A   |     | A   | A   |     |
| B  |    | B  | B  |    | B  | B  |    | B  | B  |     | B   | B   |     | B   | B   |     | B   |
|    | C  | C  |    | C  | C  |    | C  | C  |    | C   | C   |     | C   | C   |     | C   | C   |

TURBO-LIKE FORWARD ERROR CORRECTION ENCODER AND DECODER WITH IMPROVED WEIGHT SPECTRUM AND REDUCED DEGRADATION IN THE WATERFALL PERFORMANCE REGION

This application claims the benefit of a provisional Application No. 60/148,919 filed Aug. 13, 1999.

BACKGROUND OF THE INVENTION

1. Field of the Invention

The present invention relates generally to forward error correction encoders and decoders and more particularly, to turbo-like forward error correction encoders and decoders with improved weight spectrum and reduce degradation in the waterfall performance region.

2. Description of the Related Art

FIG. 1 illustrates a conventional Turbo encoder 10 which, as illustrated, includes two parallel constituent encoders 12, 14. An input stream x(k) is encoded by the constituent encoders 12, 14 to produce parity bits y1(k) and y2(k). The encoder 14 sees the input stream x(k) presented in a different order than the encoder 12 due to the presence of an embedded Turbo interleaver 16. The output coded bits x(k), y1(k), y2(k) are then punctured by puncturer 18 to produce the desired overall code rate. In the example, the natural rate of the Turbo encoder 10 is 1/3. FIG. 1 shows a periodic puncturing pattern that produces an output code rate equal to 1/2.

FIG. 2 illustrates another encoder 20 for a conventional turbo code proposed for third generation CDMA systems. The encoder 20, as illustrated, includes two constituent coders 22, 24 that are systematic recursive convolutional coders having the transfer function G(D). The exemplary constituent coders 22, 24 are rate 1/2 (producing one parity bit for each input information bit) and have 8 trellis states (each shift register has three delay elements 221–223 and 241–243). The overall rate of the turbo code is thus R=1/3, since each information bit produces two parity bits, one from each encoder 22, 24. Various puncturing patterns are shown in FIG. 2 to increase the code rate.

FIG. 3 illustrates a general block diagram for a Turbo code decoder 30 as generally described in C. Berrou et al., "Near Shannon Limit Error Correcting Coding and Decoding: Turbo Codes," Proceedings of ICC (Geneva, Switzerland), May 1993 and S. Benedetto et al., "Design of Parallel Concatenated Convolutional Codes," IEEE Transactions on Communications, May 1996, Vol. COM-44, pp. 591–600. Soft-decision (likelihood) information for the systematic and parity bits from a first constituent coder (such as encoder 12 in FIG. 1) are sent to a first decoder 32. The first decoder 32 generates updated soft-decision likelihood values for the information bits that are passed to a second decoder 34 as a priori information after reordering in accordance with a Turbo interleaver 36.

In addition, the second decoder 34 accepts updated likelihood information for the systematic bits via an interleaver 38, and the soft-decision information from the channel for the parity bits from a second constituent encoder (such as encoder 14 in FIG. 1). A soft-decision output of the second decoder 34 regarding updated likelihood information for the systematic bits is then fed back to the first decoder 32 via a de-interleaver 40. This process can be iterated as many times as desired. However, only a relatively small number of iterations is usually needed, since additional iterations generally produce diminishing returns. Hard decisions on the systematic information bits are made after the last decoder iteration is completed. If puncturing is used as depicted in FIG. 1, there is no likelihood information available for the corresponding parity bits. This is readily accounted for in the Turbo decoder 30 by using neutral values (favoring neither a 0-decision or a 1-decision) for the missing channel data.

If the two constituents encoders 12, 14 or 22, 24 are identical, the Turbo decoder 30 need only implement one constituent decoder 32 or 34 provided the VLSI hardware clock rate or DSP processing speed is able to support its reuse every half iteration.

Turbo codes as described above in conjunction with FIGS. 1–3 are the current state of the art. Additional details can be found in U.S. Pat. No. 5,446,747 to Berrou and Turbo codes implemented on the Turbo encoder and decoder structures described in conjunction with FIGS. 1–3 operate in two regions; a waterfall region and an error asymptote region. It is known that adding additional constituent encoders to a Turbo encoder can improve the error asymptote performance. However, this improvement comes at the cost of degrading the performance in the waterfall region. Research has shown that the performance in the waterfall region is largely due to convergence characteristics of the iterative decoder rather than the code rate spectrum. In general, the more complicated the code, the less efficient the error of decoder, leading to a degradation in waterfall performance.

SUMMARY OF THE INVENTION

The present invention is directed to an encoder, a decoder, a method of encoding, and a method of decoding, which preserve performance in the waterfall region, while improving upon performance in the error asymptote region.

The present invention is a modification of the basic Turbo encoder and decoder structures that preserves the Turbo coder performance in the waterfall region while improving upon performance in the error asymptote region.

The present invention provides a new code construction based on the Turbo code structure (in one example, parallel concatenation of constituent codes) that shares the performance of Turbo codes at low SNR while improving upon their asymptotic performance (so-called error floor region). The present invention includes applying a parser (or other similar element) to the input bit stream, the purpose of which is to assign input bits to a subset of the constituent encoders in a pseudo-random fashion. Provided each bit is presented to at least two of the constituent encoders, iterative decoding can still be accomplished in a similar fashion as for a Turbo code. As a result, each constituent decoder may only update the likelihood information associated with the information bits parsed to the corresponding encoder. The parsing strategy breaks up input sequences producing low Hamming weight error events, thereby improving the weight spectrum and asymptotic performance of the code, while not impacting the waterfall region performance of the corresponding Turbo code.

The addition of the parser may also strengthen the weight spectrum without adversely affecting convergence of the iterative decoder.

BRIEF DESCRIPTION OF THE DRAWINGS

FIG. 6 illustrates the operation of the parser in one exemplary of the present invention.

DETAILED DESCRIPTION OF THE PREFERRED EMBODIMENTS

Figure 4:
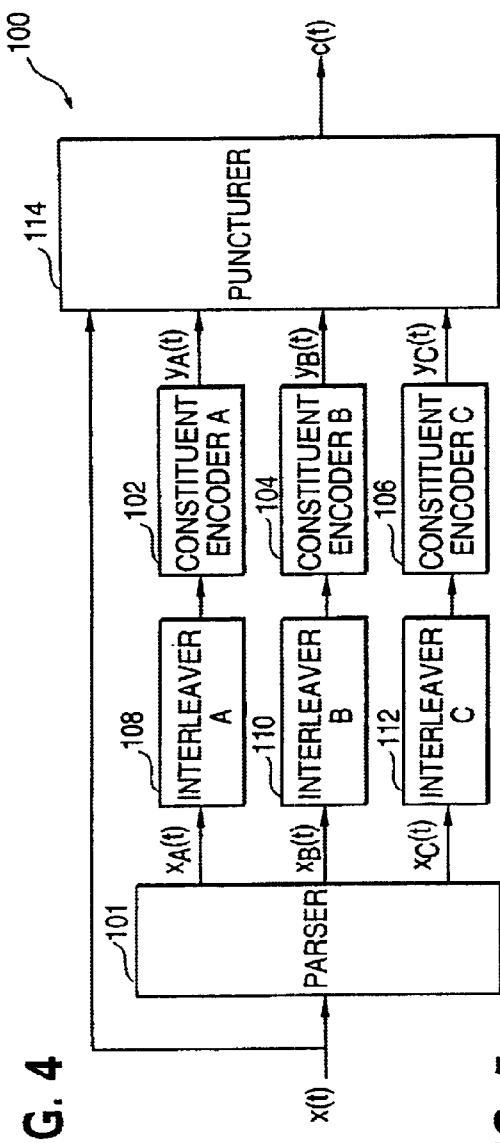
FIG. 4 illustrates an encoder, in one exemplary embodiment of the present invention.

FIG. 4 illustrates an encoder 100 in one embodiment of the present invention. In FIG. 4, the input information bit stream x(t) is parsed by parser 101 in a pseudo-random manner among three constituent encoders 102, 104, 106. Each of the parsed substreams $X_A(t)$, $X_B(t)$, $x_C(t)$ are separately interleaved by interleavers 108, 110, 112 and then separately encoded by one of the constituent encoders 102, 104, 106. The puncturing unit 114 removes coded bits from the output stream according to a prescribed puncturing pattern in order to produce the desired overall code rate.

Although the encoder 100 has been illustrated with three constituent encoders 102, 104, 106, it is clear that a different number constituent encoders could also be utilized.

The parser 101 may ensure that every information bit is encoded by at least two of the constituent encoders 102, 104, 106 in order that iterative soft-decision decoding can efficiently refine the likelihood decision statistic for each information bit based on outputs from multiple semi-independent constituent decoders.

Likewise, the interleaving applied to the separate substreams by interleavers 108, 110, 112 may be substantially independent of one another in order to produce a high degree of randomness among the output coded substreams. One of the interleavers 108, 110, 112 can be taken to be the identity mapping (which is equivalent to saying that the interleaver is not implemented). To reduce implementation complexity, the interleavers applied to the other substreams could be identical.

As in ordinary turbo codes, the constituent encoders 102, 104, 106 can be the same or different. Keeping the constituent encoders 102, 104, 106 the same has the advantage that the implementation complexity is reduced.

Figure 5:
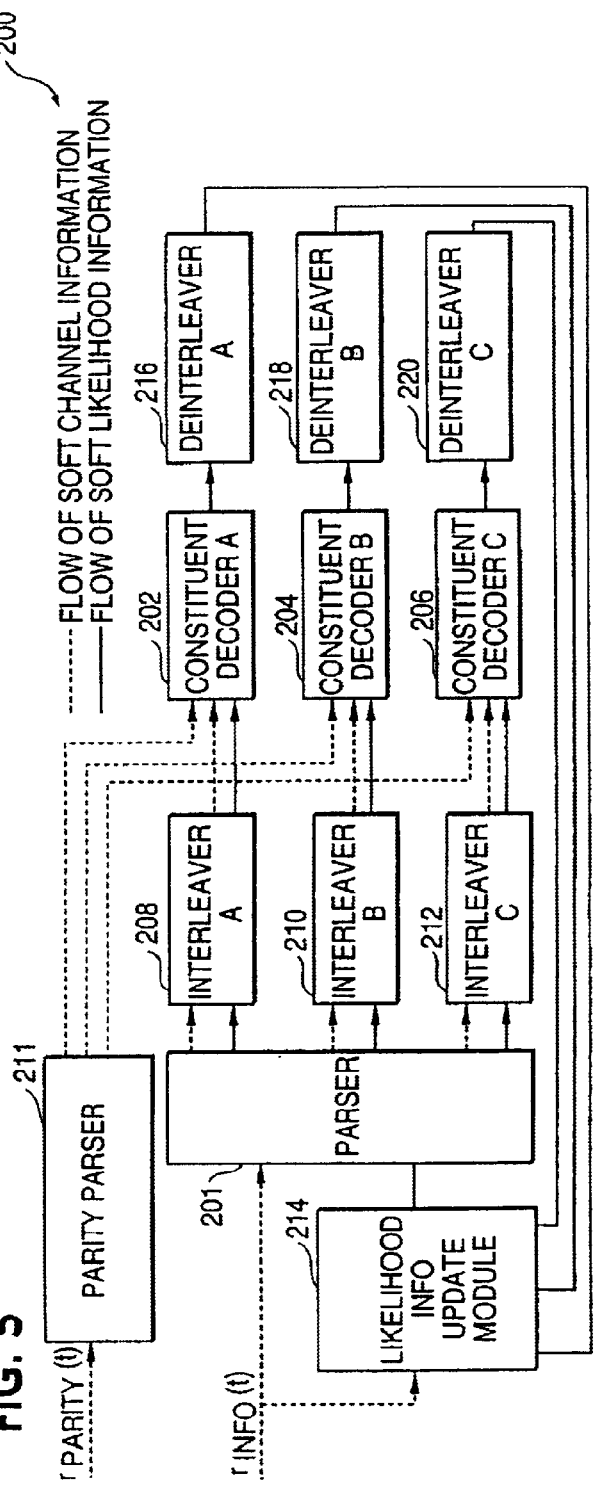
FIG. 5 illustrates a decoder, in one exemplary embodiment of the present invention.

A decoder 200 is shown in FIG. 5. The decoder 200 can be implemented in either VLSI or on a digital signal processor (DSP). As in the conventional turbo code case, the decoder 200 implements soft-input/soft-output decoders 202, 204, 206 for each of the constituent codes. In FIG. 5, the constituent decoders 202, 204, 206 (along with de-interleavers 216, 218, 220) are shown operating in parallel on soft channel information and soft likelihood information corresponding to the information and parity bits associated with the corresponding encoder (102, 104, 106 in FIG. 4). The decoders 202, 204, 206 could also be operated sequentially, one after another, as in a conventional turbo decoder. This latter option would be especially attractive when the constituent codes are all the same so that a single constituent decoder could be re-used.

In FIG. 5, the decoder 200 is presented with soft channel information $r_{info}(t)$, corresponding to the systematic information bits, and soft channel information $r_{parity}(t)$, corresponding to the transmitted parity bits. The soft information associated with the systematic bits are parsed by parser 201 and interleaved by interleavers 208, 210, 212 into substreams A, B and C before being delivered to the constituent decoders 202, 204, 206. These parsing and interleaving functions may mirror those performed by the encoder 100.

Each constituent decoder 202, 204, 206 also receives the soft channel information associated with each parity produced by the corresponding constituent encoder via parity parser 211. Each soft-input/soft-output constituent decoder 202, 204, 206 then processes these inputs and produces new likelihood information via de-interleavers 216, 218, 220 for each of the systematic bits to which it has visibility. The likelihood information provided by each constituent encoder 202, 204, 206 are combined by the Likelihood Information Update module 214 to provide updated likelihood information for all of the systematic bits. This completes one iteration of the decoding process.

The decoding process can be iterated as many times as desired, either using a fixed stopping rule or a dynamic stopping rule, both of which are known to one of ordinary skill in this art. A common fixed stopping rule is to perform some maximum number of iterations that the processor (VLSI or DSP) can perform within the available timeline. A common dynamic stopping rule is to continue to iterate until the decoded data passes a cyclic redundancy check (CRC) or a maximum number of iterations is reached. Once the desired number of iterations has been completed, hard decisions regarding the values of the systematic information bits are made based on the final likelihood information provided by the Likelihood Information Update module 214. Note that it is possible for the decoder 200 to stop after the soft information from any of the constituent decoders 202, 204, 206 has been used to update the likelihood estimates. Thus, one could stop at any "one-third" of an iteration.

Figure 3:
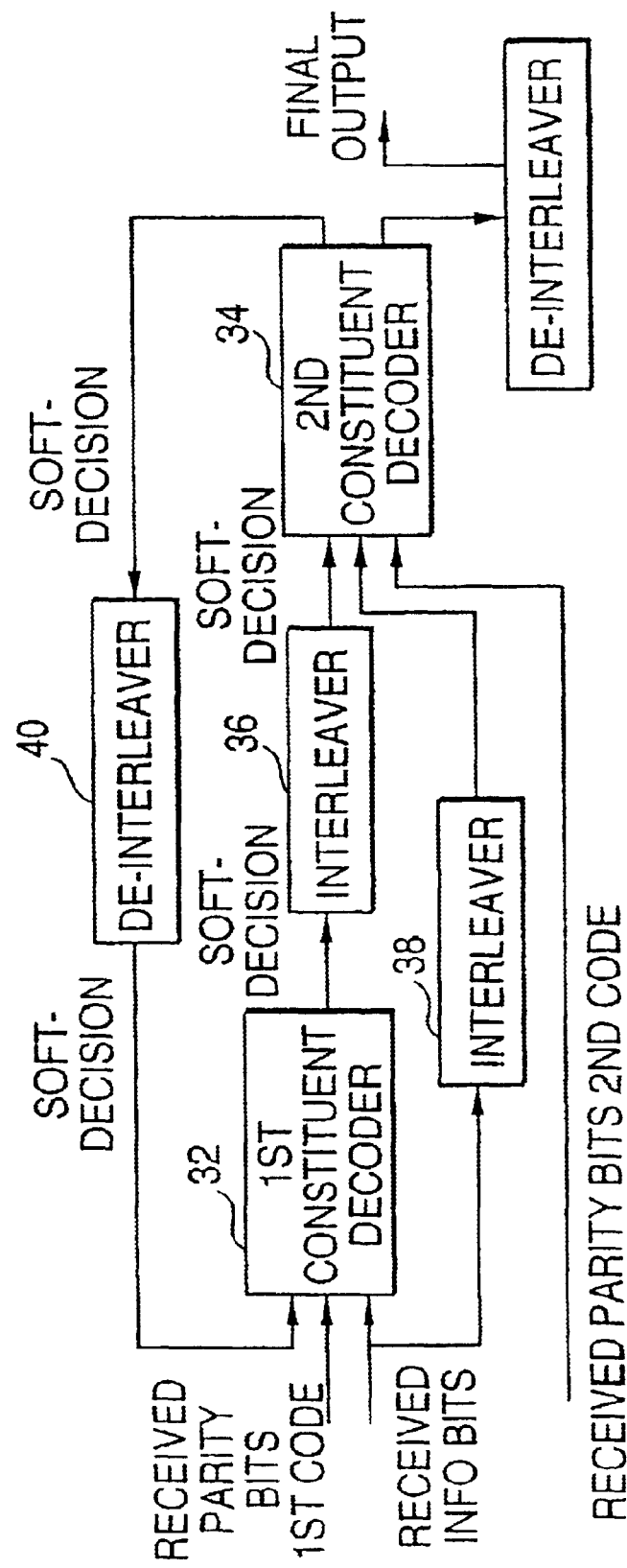
FIG. 3 illustrates a conventional Turbo decoder.

If the constituent codes are the same and the decoder 200 re-uses one constituent decoder, the complexity of the decoder of FIG. 5 is not significantly increased compared to that of FIG. 3.

EXAMPLE 1

Figure 1:
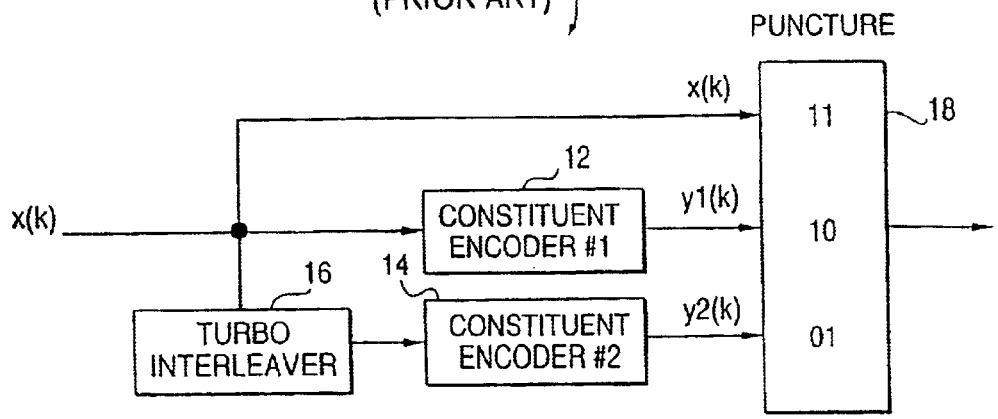
FIG. 1 illustrates a conventional Turbo encoder.
Figure 2:
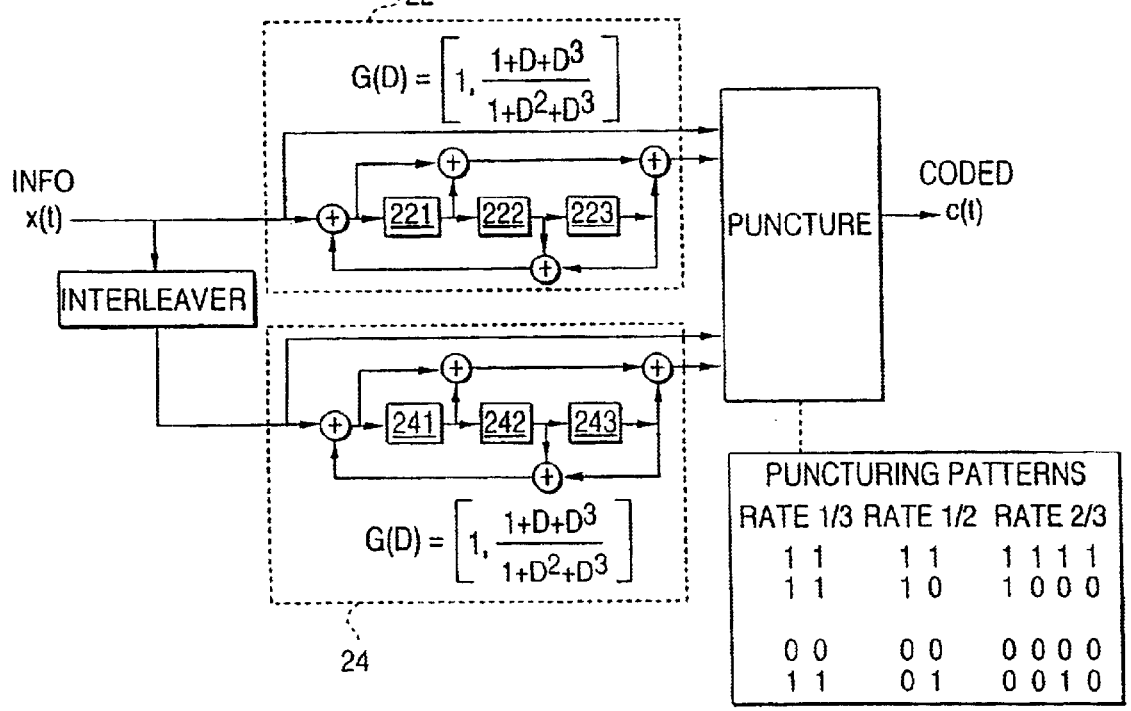
FIG. 2 illustrates another conventional encoder.

This example compares the new code construction of the present invention with the conventional turbo code of FIG. 2. In this example, there are three constituents identical to the 8-state recursive convolutional codes used by the conventional turbo code of FIG. 2. In the new code of the present invention, the input systematic bits are parsed as shown in FIG. 6. That is, constituent encoder A (202) sees every information bit x(t) for which t=0 or 1 modulo 3; constituent encoder B (204) sees every information bit x(t) for which t=0 or 2 modulo 3; and constituent encoder C (206) sees every information bit x(t) for which t=1 or 2 modulo 3. Thus every input bit is processed by two of the constituent encoders.

If there are a total of N information bits, then each constituent encoder A, B, C (202, 204, 206) produces 2N/3 output parity bits. The overall code rate is therefore R=N/[N+3·(2N/3)]=1/3, the same as the conventional turbo code of FIG. 2. If a higher composite code rate is desired, then a simple period puncturing scheme similar to that of FIG. 2 can also be applied to the new code construction. For example, the pattern

| Systematic: | 1 | 1 | 1 |
| --- | --- | --- | --- |
| Parity A: | 1 | 0 | N/A |
| Parity B: | 0 | N/A | 1 |
| Parity C: | N/A | 1 | 0 | produces an overall rate R=1/2.

One advantage of parsing is that low Hamming weight inputs are broken up before delivery to the constituent encoders (202, 204, 206). For example, consider the input sequence having exactly two ones at the following positions: x(0)=x(10)=1. The input to the first constituent encoder 202 includes a critical input sequence in which the ones are distance 7 apart. The first constituent encoder 202 will therefore produce a low weight output. Each of the remaining constituent encoders 204, 206 sees only one of the two input 1s. Thus, neither of the two other constituent encoders 204, 206 will produce low output weight. The overall effect of the parsing is to reduce the number of low weight code words compared to the conventional turbo code of FIG. 2. This improves the error asymptote performance of the new code construction compared to the conventional turbo code.

Although additional constituent encoders are known to enhance the error asymptote performance of a conventional turbo code, they also degrade the waterfall region of the performance curve. Theoretical analysis of the conventional iterative turbo decoder as shown in H. El-Gamal et al., "Analyzing the Turbo Decoder Using the Gaussian Approximation," submitted to 1999 Allerton Conference at the University of Illinois at Champaign-Urbana has shown that the degradation occurs due to breakdown in the iterative decoder rather than a change in the code weight spectrum. In the code construction of the present invention, each information bit is associated with two parity bits from two different constituent encoders, as in the case of the conventional turbo code.

Theoretical analysis shows that for large enough block sizes (for example, >1000) the structure of the present invention will produce the same waterfall performance as the conventional turbo code. Thus, unlike any prior turbo-like construction, the present invention improves the error asymptote performance while preserving the waterfall performance.

Figure 7:
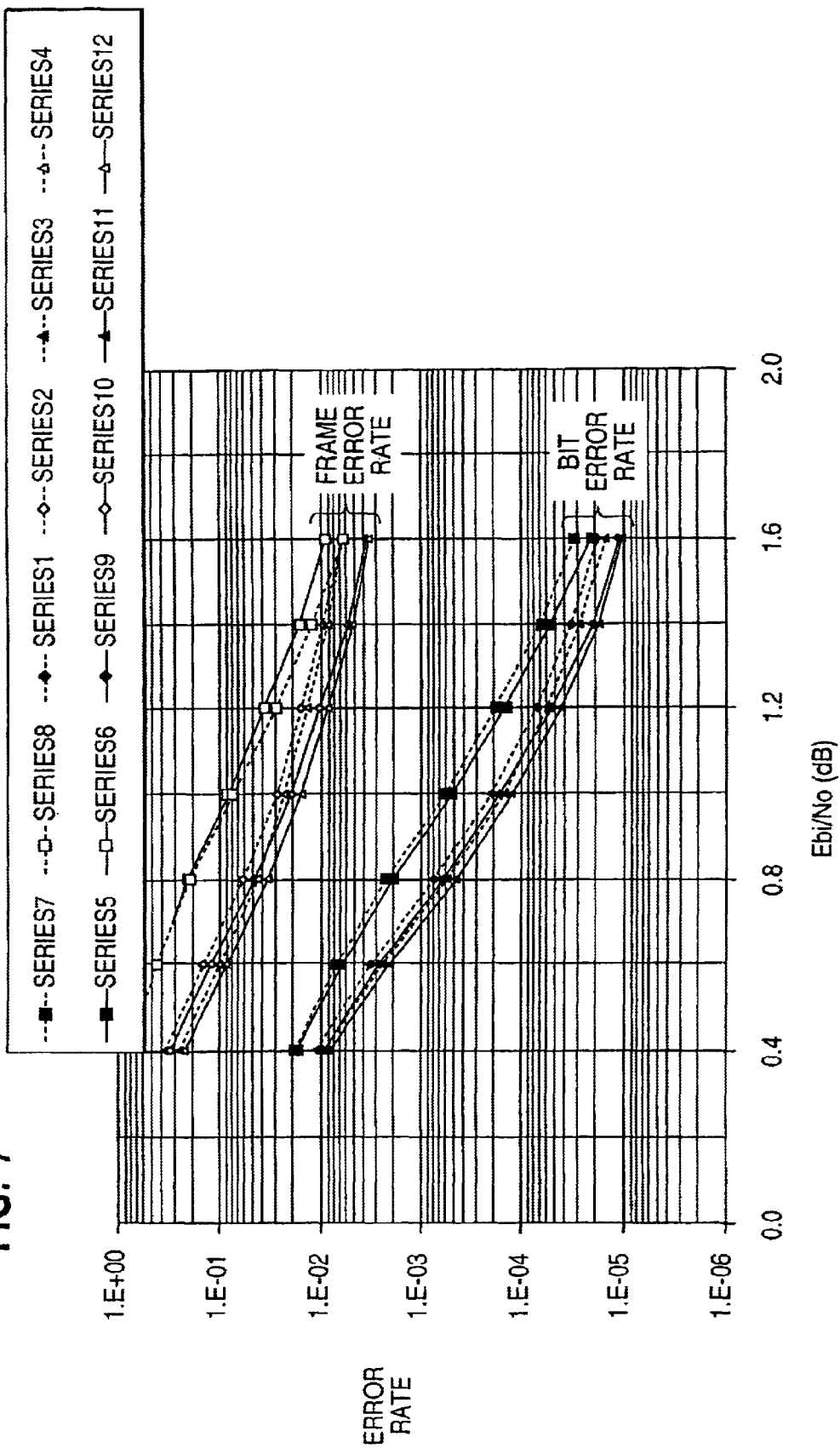
FIG. 7 illustrates reductions in both frame error rate and bit error rate using the present invention.

FIG. 7 illustrates the results achieved using the present invention. In particular, the dashed line curves illustrate the frame error rates and bit error rates for a regular, four-state (with R=1/3 with a frame size of 1000 using random interleaving), whereas the solid lines illustrate the frame error rates and bit error rates for a parsed four-state (R=1/3, with a frame size of 1000, using random interleaving). As illustrated in FIG. 7, in the waterfall performance region (between 0.4 and 1.2 Ebi/No), the performance is essentially the same in the parsed state as in the regular state. However, in the error asymptote performance region, (0.9 to 1.6 Ebi/No), the performance using the parser is noticeably improved for both the frame error rate and the bit error rate.

Turbo codes are utilized for diverse product lines including DirecPC™ and the Personal Earth Station™ (PES). Due to the improved error asymptote performance realized by the present invention, the present invention is also applicable to other diverse product lines.

Although the present invention has been described above in conjunction with the parallel code, serial codes may also be utilized. Additionally, trellis-coded modulation, based on turbo codes may also be utilized in the present invention, both serial and parallel.

The present invention has been described above in connection with a puncturer 114 illustrated in FIG. 4. However, the function of the puncturer 114 can be replaced by any hardware or software element that determines whether bits are forwarded or not. Similarly, the embodiment of the present invention has been described above in conjunction with constituent encoders 102. These encoders 102 may be block encoders, systematic encoders, convolutional encoders, and/or recursive or non-recursive encoders or a combination thereof.

Similarly, the present invention has been described above in conjunction with an interleaver 108. The interleaver 108 can be any general purpose interleaver or could be optimized for weighted spectrum characteristics. The present invention has been described in conjunction with the parser 101. However, the parser 101 could be replaced with any hardware or software which selectively outputs bits to one of a plurality of interleavers, encoders, or decoders. The parser may be implemented as combinatorial logic, FPGA, a DSP or VLSI.

With respect to the constituent decoders illustrated in FIG. 5, these constituent decoders may be soft-input/soft-output decoders used in conventional Turbo codes, maximum a posteriori (MAP) decoders, or soft-output viterbi algorithm (SOVA) decoders or a combination thereof.

As described above, one of the features of the present invention is that at least one of the encoders (or decoders) does not encode (or decode) all of the bits. Similarly, although the present invention as described above, encodes every bit twice, some of the bits could be included three or more times. Further, it is not necessary that each of the bits be included twice, although this technique is preferable in order to obtain the benefit of Turbo processing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for error-correction coding of data elements, comprising:

parsing the data elements into a plurality of pseudo-random streams;

temporally interleaving said plurality of pseudo-random streams to modify the order of said data elements;

encoding the plurality of interleaved pseudo-random streams; and outputting the encoded plurality of pseudo-random streams.

2. The method of claim 1, wherein said interleaving and encoding is performed by at least three independent and parallel coding paths.

3. The method of claim 2, wherein each data element is supplied to at least two of said at least three independent and parallel coding paths.

4. An encoder for encoding data elements, comprising:

a parser configured to receive data elements and parse the data elements into a plurality of pseudo-random streams, a plurality of interleavers each interleaver configured to receive and interleave at least one of the plurality of pseudo-random streams from said parser; and a plurality of encoders, wherein each of the plurality of encoders is configured to receive and encode at least one of the plurality of interleaved pseudo-random streams.

5. The encoder of claim 4, wherein each data element is encoded by at least two of the plurality of encoders.

6. The encoder of claim 4, further comprising:

a puncturer for receiving the encoded pseudo-random streams from the plurality of encoders and providing an output code at a desired rate.

7. The encoder of claim 4, wherein each of said plurality of interleavers, is configured to output an interleaved bit stream to at least a corresponding one of said plurality of encoders.

8. An encoder, comprising:
a parser for receiving an input information bit stream and parsing the input information bit stream into a plurality of pseudo-random bit streams; and
a plurality of encoders, each encoder configured to receive and encode at least one of the plurality of pseudo-random bit streams.

9. The encoder of claim 8, further comprising:
a puncturer for receiving the plurality of encoded bit streams from the plurality of encoders and providing an output code at a desired rate.

10. The encoder of claim 8, further comprising:
a plurality of interleavers, each for receiving and interleaving at least one of the plurality of pseudo-random bit streams from said parser, and outputting the interleaved bit stream to at least a corresponding one of said plurality of encoders.

11. A method for error-correction decoding of data elements, comprising:
parsing the data elements into a plurality of pseudo-random streams;
temporally interleaving said data elements to modify the order in which said data elements are supplied to at least one of a plurality of independent and parallel decoding paths; and
decoding the plurality of interleaved pseudo-random streams.

12. The method of claim 11, wherein said interleaving and decoding is performed by at least three independent and parallel decoding paths.

13. The method of claim 12, wherein each data element is supplied to at least two of said at least three independent and parallel decoding paths.

14. A decoder for decoding data elements, comprising:
a parser configured to receive the data elements and parse the data elements into a plurality of pseudo-random streams;
a plurality of interleavers, each interleaver configured to receive and interleave at least one of the plurality of pseudo-random streams and output an interleaved bit stream; and
a plurality of decoders, wherein each of the plurality of decoders is configured to decode at least one of the plurality of interleaved bit streams.

15. The decoder of claim 14, wherein each of the plurality of decoders receives and decodes at least one of the plurality of interleaved bit streams.

16. The decoder of claim 15, further comprising:
a plurality of deinterleavers, each for receiving and deinterleaving at least one decoded bit stream from said plurality of decoders.

17. The decoder of claim 14, further comprising:
a parity parser for receiving parity information and providing the parity information to the plurality of decoders at a desired rate.

18. A decoder, comprising:
a parser for receiving an encoded bit stream and parsing the received bit stream into a plurality of pseudo-random encoded bit streams; and
a plurality of decoders, each for receiving and decoding at least one of the plurality of pseudo-random encoded bit streams.

19. The decoder of claim 18, further comprising:
a parity parser for receiving parity information and providing the parity information to said plurality of decoders at a desired rate.

20. The decoder of claim 18, further comprising:
a plurality of interleavers, each for receiving and interleaving at least one of the plurality of pseudo-random encoded bit streams from said parser, and outputting the interleaved bit stream to at least a corresponding one of said plurality of decoders; and
a plurality of deinterleavers, each for receiving and deinterleaving at least one decoded bit stream from said plurality of decoders.

* * * * *